(12) United States Patent
Okazaki et al.

(10) Patent No.: US 9,130,044 B2
(45) Date of Patent: Sep. 8, 2015

(54) SEMICONDUCTOR DEVICE AND MANUFACTURING METHOD THEREOF

(75) Inventors: Yutaka Okazaki, Isehara (JP); Atsuo Isobe, Isehara (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 90 days.

(21) Appl. No.: 13/529,125

(22) Filed: Jun. 21, 2012

(65) Prior Publication Data

US 2013/0001557 A1  Jan. 3, 2013

(30) Foreign Application Priority Data

Jul. 1, 2011 (JP) .................................. 2011-147520

(51) Int. Cl.
*H01L 29/12* (2006.01)
*H01L 29/786* (2006.01)

(52) U.S. Cl.
CPC .................................. *H01L 29/7869* (2013.01)

(58) Field of Classification Search
CPC ................... H01L 21/26506; H01L 21/26533; H01L 29/0653; H01L 29/7842; H01L 29/0649
USPC .......................................................... 257/57
See application file for complete search history.

(56) References Cited

U.S. PATENT DOCUMENTS

| | | | |
|---|---|---|---|
| 4,259,292 A | 3/1981 | Ichinose et al. | |
| 5,528,032 A | 6/1996 | Uchiyama | |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,362,082 B1* | 3/2002 | Doyle et al. | ................... 438/523 |
| 6,563,174 B2 | 5/2003 | Kawasaki et al. | |
| 6,586,802 B2 | 7/2003 | Miyamoto et al. | |
| 6,727,522 B1 | 4/2004 | Kawasaki et al. | |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Andy Huynh
*Assistant Examiner* — Sitaramarao S Yechuri
(74) *Attorney, Agent, or Firm* — Eric J. Robinson; Robinson Intellectual Property Law Office, P.C.

(57) ABSTRACT

The invention relates to a semiconductor device including an oxide semiconductor layer, a gate electrode overlapping with a channel formation region of the oxide semiconductor layer, and a source electrode or a drain electrode overlapping with a first region of the oxide semiconductor layer, and a second region between the channel formation region and the first region. An upper layer of the second region includes a microvoid. The microvoid is formed by adding nitrogen to the upper layer of the second region. Thus, upper layer of the second region contains lager amount of nitrogen than a lower layer of the second region.

14 Claims, 12 Drawing Sheets

(56) References Cited

U.S. PATENT DOCUMENTS

| | | | |
|---|---|---|---|
| 6,879,002 B2 | 4/2005 | Miyamoto et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,821,002 B2 | 10/2010 | Yamazaki et al. |
| 7,910,490 B2 | 3/2011 | Akimoto et al. |
| 7,932,521 B2 | 4/2011 | Akimoto et al. |
| 8,017,045 B2 | 9/2011 | Cho et al. |
| 8,110,436 B2 | 2/2012 | Hayashi et al. |
| 8,247,813 B2 | 8/2012 | Koyama et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0052325 A1 | 3/2003 | Miyamoto et al. |
| 2003/0189401 A1 | 10/2003 | Kido et al. |
| 2003/0197223 A1 | 10/2003 | Miyamoto et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0042743 A1 | 2/2005 | Kawai et al. |
| 2005/0199959 A1 | 9/2005 | Chiang et al. |
| 2005/0279986 A1 | 12/2005 | Punsalan et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0069209 A1 | 3/2007 | Jeong et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0029829 A1* | 2/2008 | Yang et al. ................. 257/402 |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296567 A1 | 12/2008 | Irving et al. |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0127649 A1 | 5/2009 | Uchiyama |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0155940 A1 | 6/2009 | Lee et al. |
| 2009/0261389 A1 | 10/2009 | Cho et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0044703 A1 | 2/2010 | Yabuta et al. |
| 2010/0045179 A1 | 2/2010 | Sano et al. |
| 2010/0065844 A1 | 3/2010 | Tokunaga |
| 2010/0084655 A1 | 4/2010 | Iwasaki et al. |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2010/0159639 A1* | 6/2010 | Sakata ......................... 438/104 |
| 2010/0203673 A1 | 8/2010 | Hayashi et al. |
| 2010/0237885 A1 | 9/2010 | Meng et al. |
| 2010/0258794 A1* | 10/2010 | Iwasaki et al. ................ 257/43 |
| 2011/0024740 A1 | 2/2011 | Yamazaki et al. |
| 2011/0024750 A1 | 2/2011 | Yamazaki et al. |
| 2011/0024751 A1 | 2/2011 | Yamazaki et al. |
| 2011/0027980 A1 | 2/2011 | Yamazaki et al. |
| 2011/0031491 A1 | 2/2011 | Yamazaki et al. |
| 2011/0037068 A1 | 2/2011 | Yamazaki et al. |
| 2011/0079778 A1 | 4/2011 | Yamazaki et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0127522 A1* | 6/2011 | Yamazaki ..................... 257/43 |
| 2011/0156022 A1 | 6/2011 | Yamazaki et al. |
| 2011/0163311 A1 | 7/2011 | Akimoto et al. |
| 2012/0235137 A1 | 9/2012 | Koezuka et al. |

FOREIGN PATENT DOCUMENTS

| | | |
|---|---|---|
| JP | 60-198861 A | 10/1985 |
| JP | 63-210022 A | 8/1988 |
| JP | 63 210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2000-269322 A | 9/2000 |
| JP | 2002-076356 A | 3/2002 |
| JP | 2002-289859 A | 10/2002 |

(56) References Cited

FOREIGN PATENT DOCUMENTS

| JP | 2003-078118 A | 3/2003 |
|---|---|---|
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-073705 A | 3/2007 |
| JP | 2007-096055 | 4/2007 |
| JP | 2007-123861 | 5/2007 |
| JP | 2008-141119 | 6/2008 |
| JP | 2009-129958 A | 6/2009 |
| JP | 2009-224479 A | 10/2009 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—ZnO system at 1350°C.,", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID Digest International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MOO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS,", IDW '09 : Proceedings of the 16th International Display Workshops, 2009, pp. 689-692.

Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

(56) References Cited

OTHER PUBLICATIONS

Hirao.T et al., "Novel Top-Gate Zinc Oxide Thin-Film Transistors (ZnO TFTS) for AMLCDS,", Journal of The SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFTS With a Novel Passivation Layer,", SID Digest '09 : SID International Symposium Digest of Technical Papers, May 31, 2009, pp. 284-287.
Miyasaka.M, "SUFTLA Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.
Lee.H et al., "Current Status of, Challenges to, and Perspective View of AM-OLED ,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.
Nakamura.M, "Synthesis of Homologous Compound with New Long-Period Structure,", NIRIM Newsletter, Mar. 1, 1995, vol. 150, pp. 1-4.
Kikuchi.H et al., "Polymer-Stabilized Liquid Crystal Blue Phases,", Nature Materials, Sep. 2, 2002, vol. 1, pp. 64-68.
Kimizuka.N. et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu, or Zn] at Temperatures Over 1000° C.,", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916
Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.
Orita.M et al., "Mechanism of Electrical Conductivity of Transparent InGaZnO4,", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.
Janotti.A et al., "Native Point Defects in ZnO,", Phys. Rev. B (Physical Review. B), Oct. 4, 2007, vol. 76, No. 16, pp. 165202-1-165202-22.
Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.
Janotti.A et al., "Oxygen Vacancies in ZnO,", Appl. Phys. Lett. (Applied Physics Letters) , 2005, vol. 87, pp. 122102-1-122102-3.
Oba.F et al., "Defect energetics in ZnO: A hybrid Hartree-Fock density functional study,", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor,", Philosophical Magazine, 2001, vol. 81, No. 5, pp. 501-515.
Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays,", IDW '08 : Proceedings of the 6th International Display Workshops, Dec. 3, 2008, pp. 581-584.
Kim.S et al., "High-Performance oxide thin film transistors passivated by various gas plasmas,", 214th ECS Meeting, 2008, No. 2317, ECS.
Clark.S et al., "First Principles Methods Using CASTEP,", Zeitschrift fur Kristallographie, 2005, vol. 220, pp. 567-570.
Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.
Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.
International Search Report (Application No. PCT/JP2012/004019) Dated Sep. 11, 2012.
Written Opinion (Application No. PCT/JP2012/004019) Dated Sep. 11, 2012.

* cited by examiner c-axis direction charge 0 charge +1 charge 0 a-b plane charge −1 charge 0

● In
☾ Sn
☽ Zn
● O

- In
- Ga
- Zn
- O

US 9,130,044 B2

SEMICONDUCTOR DEVICE AND MANUFACTURING METHOD THEREOF

TECHNICAL FIELD

One embodiment of the invention disclosed herein relates to a semiconductor device and a manufacturing method thereof.

BACKGROUND ART

In recent years, a technique in which transistors are manufactured using an oxide semiconductor and applied to electronic devices or optical devices has attracted attention. For example, Patent Document 1 discloses a technique in which a transistor is formed using an In—Ga—Zn-based oxide as an oxide semiconductor to manufacture a display device using the transistor.

REFERENCE

Patent Document

[Patent Document 1] Japanese Published Patent Application No. 2008-141119

DISCLOSURE OF INVENTION

In a transistor in which a channel formation region is formed in an oxide semiconductor layer (hereinafter referred to as an "oxide semiconductor transistor"), water or hydrogen may enter the oxide semiconductor layer from the outside. If heat treatment is performed on the oxide semiconductor layer which water or hydrogen has entered, hydrogen is diffused into the oxide semiconductor layer. In the oxide semiconductor layer, part of hydrogen serves as a donor to release electrons as carriers. When the carrier concentration in the oxide semiconductor layer becomes high, a channel is formed in the oxide semiconductor transistor without voltage application to a gate electrode. That is, the oxide semiconductor layer becomes an n-type oxide semiconductor layer. In such an oxide semiconductor transistor, in the case where the length of a channel formation region (hereinafter referred to as a "channel length L") is short, there is a possibility that a sufficient on/off ratio cannot be obtained, that is, drain current is constant regardless of gate voltage applied to a gate electrode, or that the ratio of the drain current when the oxide semiconductor transistor is turned off to the drain current when the oxide semiconductor transistor is turned on is not sufficient to serve as a transistor.

In manufacturing of the oxide semiconductor transistor, heat treatment is needed to improve characteristics of an oxide semiconductor transistor, and the like. However, if heat treatment is performed on the oxide semiconductor layer which water or hydrogen has entered, hydrogen is diffused into the oxide semiconductor layer, the diffused hydrogen reacts with oxygen in the oxide semiconductor layer, so that oxygen in the oxide semiconductor layer is extracted. The oxide semiconductor layer from which oxygen has extracted becomes an n-type oxide semiconductor layer. Accordingly, the oxide semiconductor transistor does not have a sufficient on/off ratio.

Further, miniaturization of an oxide semiconductor transistor used for an electronic device or an optical device is needed. The channel length L needs to be short in order to miniaturize the oxide semiconductor transistor; however, as mentioned above, a short channel length L may raise the possibility that a sufficient on/off ratio cannot be obtained.

The oxide semiconductor transistor in which a sufficient on/off ratio cannot be obtained does not function as, for example, a switching element. Thus, reliability of an electronic device or an optical device formed by using the oxide semiconductor transistor in which a sufficient on/off ratio cannot be obtained might be decreased.

In view of the above, an object of one embodiment of the disclosed invention is to prevent an oxide semiconductor transistor with a short channel length L from having a low on/off ratio.

One embodiment of the disclosed invention relates to a semiconductor device including an oxide semiconductor layer; a gate insulating film provided over the oxide semiconductor layer; a gate electrode over a channel formation region of the oxide semiconductor layer with the gate insulating film provided therebetween; and a source electrode or a drain electrode provided over a first region of the oxide semiconductor layer. In the semiconductor device, a second region is provided between the channel formation region and the first region and an upper layer of the second region includes a microvoid.

One embodiment of the disclosed invention relates to a semiconductor device including an oxide semiconductor layer; a gate insulating film provided over the oxide semiconductor layer; a gate electrode over a channel formation region of the oxide semiconductor layer with the gate insulating film provided therebetween; and a source electrode or a drain electrode provided over a first region of the oxide semiconductor layer. In the semiconductor device, a second region is provided between the channel formation region and the first region and an upper layer of the second region contains nitrogen.

One embodiment of the disclosed invention relates to a semiconductor device including an oxide semiconductor layer; a gate insulating film provided over the oxide semiconductor layer; a gate electrode over a channel formation region of the oxide semiconductor layer with the gate insulating film provided therebetween; and a source electrode or a drain electrode provided over a first region of the oxide semiconductor layer. In the semiconductor device, a second region is provided between the channel formation region and the first region and an upper layer of the second region contains more nitrogen than a lower layer of the second region.

Nitrogen is added to the upper layer of the second region at a high dose, whereby a microvoid is formed. Hydrogen from external air or an insulating film is adsorbed to the inner wall of the microvoid.

The microvoid has a low density compared with the surrounding thereof, or an empty space. The microvoid is substantially a spherical region where the diameter is larger than or equal to 0.1 nm and smaller than or equal to 10 nm, preferably larger than or equal to 2 nm and smaller than or equal to 7 nm, or a region where a plurality of spherical regions overlaps each other.

As described above, when hydrogen from the outside is diffused and reacts with oxygen in the oxide semiconductor layer, oxygen is extracted from the oxide semiconductor layer. When oxide is extracted from the oxide semiconductor layer, an oxide semiconductor transistor having a low on/off ratio is obtained. Note that when hydrogen is adsorbed to the inner wall of the microvoid, oxygen is not extracted from the oxide semiconductor layer.

In the case of an oxide semiconductor transistor including such an oxide semiconductor layer in which hydrogen is adsorbed to the inner wall of the microvoid and from which oxygen is not extracted, the oxide semiconductor transistor is prevented from having a low on/off ratio.

As described above, the provision of a microvoid in the oxide semiconductor layer enables the oxide semiconductor transistor to have a sufficient on/off ratio. However, the formation of the microvoid makes the on-state current of the oxide semiconductor transistor low.

Meanwhile, the microvoid is not formed in the first region and the lower layer of the second region if nitrogen is added so that the first region and the lower layer of the second region are regions without nitrogen, or regions containing nitrogen at an extremely low concentration compared with the upper layer of the second region. Thus, the lower layer of the second region is provided to prevent the on-state current of the oxide semiconductor transistor from decreasing.

In one embodiment of the disclosed invention, the concentration of nitrogen in the upper layer of the second region is $1 \times 10^{21}$ cm$^{-3}$ or more.

Further, in one embodiment of the disclosed invention, instead of nitrogen, oxygen may be added to the oxide semiconductor layer. Also in the case where oxygen is added to the oxide semiconductor layer, a microvoid is formed in the oxide semiconductor layer. As in the case of adding nitrogen, hydrogen is adsorbed to the inner wall of the microvoid; thus, oxygen is not extracted from the oxide semiconductor layer. The oxide semiconductor transistor using the oxide semiconductor layer to which oxygen is added instead of nitrogen has a sufficient on/off ratio similarly to the case where nitrogen is added.

One embodiment of the disclosed invention relates to a semiconductor device including an oxide semiconductor layer; a gate insulating film provided over the oxide semiconductor layer; a gate electrode over a channel formation region of the oxide semiconductor layer with the gate insulating film provided therebetween; and a source electrode or a drain electrode provided over a first region of the oxide semiconductor layer. In the semiconductor device, an upper layer of a second region between the channel formation region and the first region contains more oxygen than a lower layer of the second region.

In one embodiment of the disclosed invention, the concentration of oxygen in the upper layer of the second region is $1 \times 10^{21}$ cm$^{-3}$ or more.

In one embodiment of the disclosed invention, the upper layer of the second region includes a microvoid.

One embodiment of the disclosed invention relates to a method for manufacturing a semiconductor device, including the steps of forming an oxide semiconductor layer; forming a source electrode or a drain electrode over a first region of the oxide semiconductor layer; forming a gate electrode to overlap with a channel formation region of the oxide semiconductor layer with a gate insulating film provided therebetween; adding nitrogen to an upper layer of a second region between the first region and the channel formation region; and heating the oxide semiconductor layer including the upper layer of the second region to which nitrogen is added.

In one embodiment of the disclosed invention, a dose of nitrogen is $5 \times 10^{16}$ cm$^{-2}$ or more.

One embodiment of the disclosed invention relates to a method for manufacturing a semiconductor device, including the steps of forming an oxide semiconductor layer; forming a source electrode or a drain electrode over a first region of the oxide semiconductor layer; forming a gate electrode to overlap with a channel formation region of the oxide semiconductor layer with a gate insulating film provided therebetween; adding oxygen to an upper layer of a second region between the first region and the channel formation region; and heating the oxide semiconductor layer including the upper layer of the second region to which oxygen is added.

In one embodiment of the disclosed invention, a dose of oxygen is $5 \times 10^{16}$ cm$^{-2}$ or more.

According to one embodiment of the disclosed invention, an oxide semiconductor transistor with a short channel length L can have a sufficient on/off ratio.

BEST MODE FOR CARRYING OUT THE INVENTION

Figure 1:
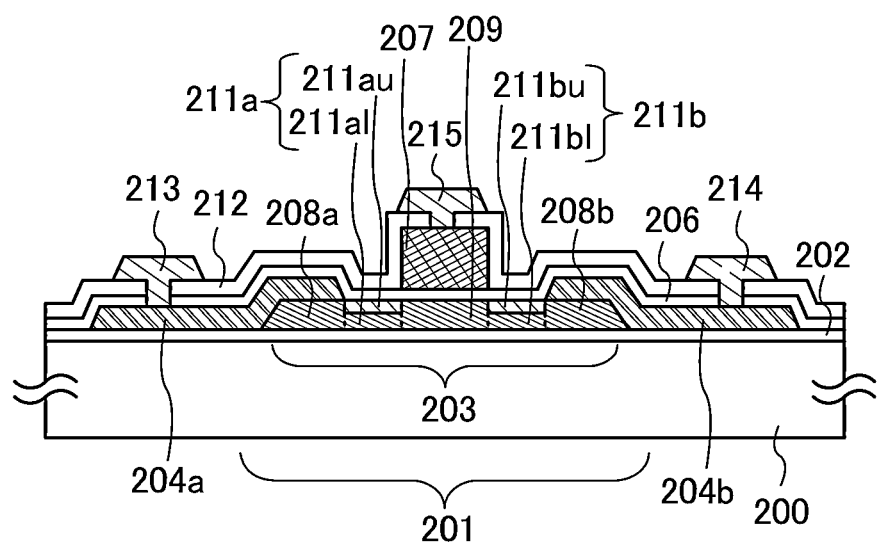
FIG. 1 is a cross-sectional view of a semiconductor device.

Embodiments of the invention disclosed in this specification will be hereinafter described with reference to the accompanying drawings. Note that the invention disclosed in this specification can be carried out in a variety of different modes, and it is easily understood by those skilled in the art that the modes and details of the invention disclosed in this specification can be changed in various ways without departing from the spirit and scope thereof. Therefore, the present invention is not construed as being limited to description of the embodiments and example. Note that, in the drawings hereinafter shown, the same portions or portions having similar functions are denoted by the same reference numerals, and repeated description thereof will be omitted.

Note that in the invention disclosed in this specification, a semiconductor device refers to an element or a device which functions by utilizing a semiconductor and includes, in its category, an electric device including an electronic circuit, a display device, a light-emitting device, and the like and an electronic appliance on which the electric device is mounted.

Note that the position, size, range, or the like of each structure shown in the drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not mean limitation of the number of components.

[Embodiment 1]
(Structure of Oxide Semiconductor Transistor)

FIG. 1 shows a structure of an oxide semiconductor transistor of this embodiment. An oxide semiconductor transistor 201 shown in FIG. 1 includes a base insulating film 202 over a substrate 200, an oxide semiconductor layer 203 formed over the base insulating film 202 and functioning as an active layer, electrodes 204a and 204b formed over the oxide semiconductor layer 203 and functioning as a source electrode and a drain electrode, a gate insulating film 206 formed over the oxide semiconductor layer 203 and the electrodes 204a and 204b, and a gate electrode 207 provided to overlap with the oxide semiconductor layer 203 with the gate insulating film 206 provided therebetween.

The oxide semiconductor transistor 201 shown in FIG. 1 is of a top-gate type where the gate electrode 207 is formed over the oxide semiconductor layer 203, and is also of a top-contact type where the electrodes 204a and 204b functioning as the source electrode and the drain electrode are formed over the oxide semiconductor layer 203.

Regions 208a and 208b where the electrodes 204a and 204b overlap with the oxide semiconductor layer 203 function as a source region and a drain region.

In the oxide semiconductor transistor 201, the electrodes 204a and 204b do not overlap with the gate electrode 207. In regions of the oxide semiconductor layer 203, which are positioned between the electrodes 204a and 204b and the gate electrode 207, regions 211a and 211b are formed. The region 211a includes an upper layer 211au and a lower layer 211al, and the region 211b includes an upper layer 211bu and a lower layer 211bl. The upper layers 211au and 211bu each contain nitrogen, whereas the lower layers 211al and 211bl do not contain nitrogen or contain nitrogen at a concentration which is extremely low compared with the upper layers 211au and 211bu. The concentration of nitrogen in each of the upper layers 211au and the 211bu is preferably $1 \times 10^{21}$ cm$^{-3}$ or more.

Nitrogen is added to the upper layers 211au and 211bu at a high dose. By the addition of nitrogen at a high dose, a nano-sized microvoid is formed. A plurality of microvoids is formed in a region of the oxide semiconductor layer 203 to which nitrogen is added.

The microvoid has a low density compared with the surrounding thereof or an empty space. The microvoid is substantially a spherical region where the diameter is larger than or equal to 0.1 nm and smaller than or equal to 10 nm, preferably larger than or equal to 2 nm and smaller than or equal to 7 nm, or a region where a plurality of spherical regions overlaps each other.

As described above, when hydrogen from the outside is diffused into the oxide semiconductor layer 203, the hydrogen reacts with oxygen in the oxide semiconductor layer 203 and oxygen is extracted from the oxide semiconductor layer 203. When oxygen is extracted from the oxide semiconductor layer 203, the oxide semiconductor transistor has a low on/off ratio. However, if hydrogen is adsorbed to the inner walls of the microvoids, oxygen is not extracted from the oxide semiconductor layer 203.

As described above, the oxide semiconductor transistor 201 including an oxide semiconductor layer 203 in which hydrogen is adsorbed to the inner walls of the microvoids and from which oxygen is not extracted becomes a transistor with a sufficient on/off ratio.

When nitrogen is added to the oxide semiconductor layer 203, accelerating voltage is controlled so that nitrogen is not added to the lower layers 211al and 211bl. That is, the lower layers 211al and 211bl are regions which do not contain nitrogen or regions which contain nitrogen at a concentration which is extremely low compared with the upper layers 211au and 211bu.

The microvoids are provided in the oxide semiconductor layer 203 as described above, so that an oxide semiconductor transistor with a sufficient on/off ratio can be formed. However, on-state current of the oxide semiconductor transistor 201 is reduced by the formation of the microvoids.

Nitrogen is not added to the lower layers 211al and 211bl, whereby microvoids are not formed therein. Thus, the decrease in on-state current can be suppressed by the formation of the lower layers 211al and 211bl.

Further, microvoids can be formed in the upper layers 211au and 211bu by addition of oxygen to the upper layers 211au and 211bu instead of nitrogen.

As described above, hydrogen from external air or an insulating film is adsorbed to the inner walls of the microvoids by the formation of microvoids in the upper layers 211au and 211bu. Further, oxygen is not extracted from the oxide semiconductor layer 203 by the adsorption of hydrogen to the inner walls of the microvoids. Thus, the oxide semiconductor transistor 201 including such an oxide semiconductor layer 203 becomes an oxide semiconductor transistor with a sufficient on/off ratio similarly to the case where nitrogen is added.

The concentration of oxygen in each of the upper layers 211au and the 211bu is preferably $1 \times 10^{21}$ cm$^{-3}$ or more.

Further, the oxide semiconductor layer 203 may include a c-axis aligned crystalline oxide semiconductor (CAAC-OS). In the case where the oxide semiconductor layer 203 includes the CAAC-OS, the conductivity of the oxide semiconductor layer 203 can be increased as compared with the case of an amorphous semiconductor; thus, the resistance between the electrode 204a and the electrode 204b can be decreased. Note that a CAAC-OS is described below.

In FIG. 1, an insulating film 212 is formed to cover the oxide semiconductor transistor 201. A wiring 213 electrically connected to the electrode 204a, a wiring 214 electrically connected to the electrode 204b, and a wiring 215 electrically connected to the gate electrode 207 are formed over the insulating film 212.

<Method for Manufacturing Oxide Semiconductor Transistor>

A method for manufacturing the oxide semiconductor transistor 201 shown in FIG. 1 is described below.

First, the base insulating film 202 is formed over the substrate 200. In this embodiment, a glass substrate is used as the substrate 200 and a silicon oxide film is used as the base insulating film 202.

Figure 2A:
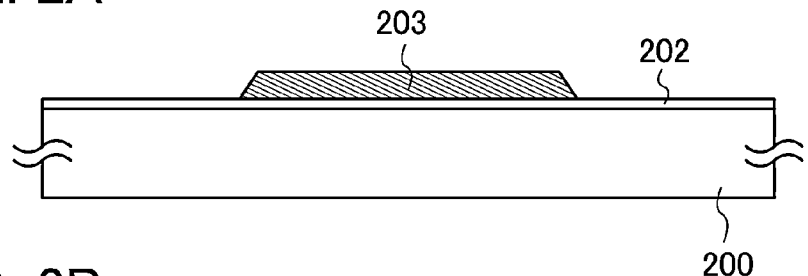
FIGS. 2A to 2D are cross-sectional views showing a method for manufacturing a semiconductor device.

An oxide semiconductor film is formed over the base insulating film 202, and the oxide semiconductor film is processed by etching or the like so that the oxide semiconductor layer 203 having an island shape is formed (see FIG. 2A). Note that the details of a material for the oxide semiconductor layer 203 are described later. The oxide semiconductor film is formed so as to have enough thickness to form the upper layers to which nitrogen is added in a later step and lower layers to which nitrogen is not added. The thickness of the oxide semiconductor film is, for example, greater than or equal to 20 nm and less than or equal to 100 nm, preferably greater than or equal to 40 nm and less than or equal to 80 nm.

The electrodes 204a and 204b are formed so as to each overlap with part of the oxide semiconductor layer 203. As a material for the electrodes 204a and 204b, for example, a stacked film in which a titanium film, an aluminum film, and a titanium film are formed in this order is used.

Figure 2B:
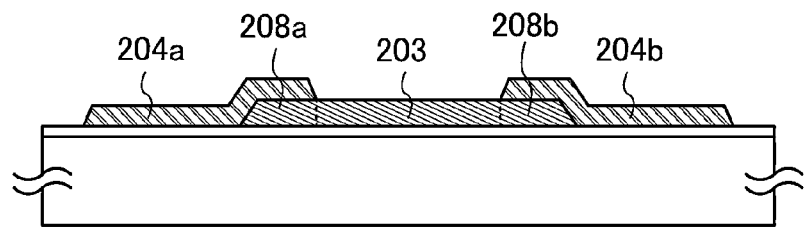

A region where the oxide semiconductor layer 203 overlaps with the electrode 204a is the region 208a, and a region where the oxide semiconductor layer 203 overlaps with the electrode 204b is the region 208b (see FIG. 2B). The regions 208a and 208b function as a source region and a drain as described above.

Next, the gate insulating film 206 is formed to cover the base insulating film 202, the oxide semiconductor layer 203, and the electrodes 204a and 204b. As the gate insulating film 206, for example, a silicon oxide film is used.

Figure 2C:
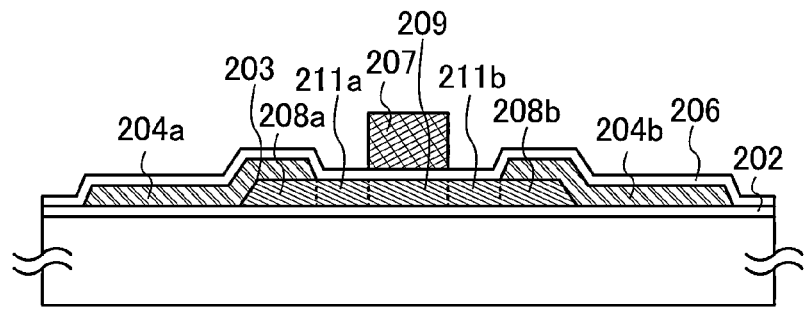

Next, the gate electrode 207 is formed over a region of the oxide semiconductor layer 203, which does not overlap with the electrodes 204a and 204b, with the gate insulating film 206 provided therebetween (see FIG. 2C). As the gate electrode 207, for example, a stacked film of a tantalum nitride film and a tungsten film is used. A region of the oxide semiconductor layer 203, which overlaps with the gate electrode 207, is a channel formation region 209. A region between the region 208a and the channel formation region 209 is the region 211a, and a region between the region 208b and the channel formation region 209 is the region 211b. The regions 211a and 211b do not overlap with the gate electrode 207, and the electrodes 204a and 204b.

Figure 2D:
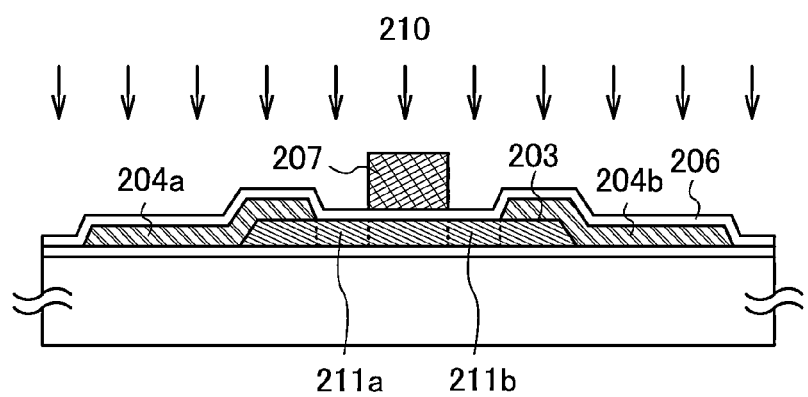

Next, nitrogen 210 is added to the oxide semiconductor layer 203 (see FIG. 2D). The nitrogen 210 is added under conditions where the dose is high and the accelerating voltage is low. When the nitrogen 210 is added to the oxide semiconductor layer 203, the gate electrode 207 and the electrodes 204a and 204b each serve as a mask.

By the addition of the nitrogen 210 under such conditions, the upper layer 211au in the region 211a and the upper layer 211bu in the region 211b can be high-concentration nitrogen-containing regions.

Figure 11A:
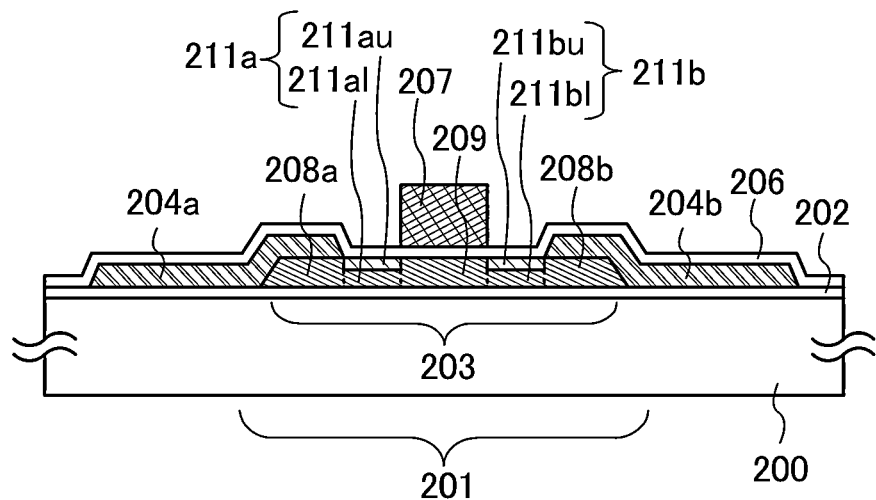
FIGS. 11A and 11B are cross-sectional views showing a method for manufacturing a semiconductor device.

As described above, the oxide semiconductor transistor 201 can be manufactured (see FIG. 11A).

Figure 11B:
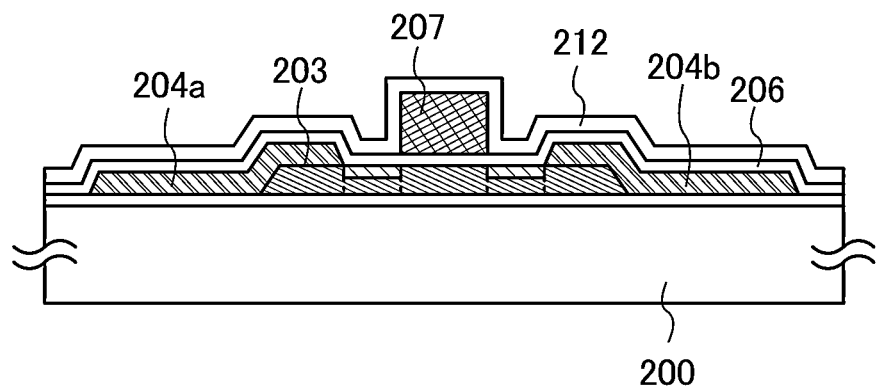

After the nitrogen 210 is added, the insulating film 212 is formed to cover the substrate 200, the base insulating film 202, the oxide semiconductor layer 203, the electrodes 204a and 204b, the gate insulating film 206, and the gate electrode 207 (see FIG. 11B). After the formation of the insulating film 212, heat treatment is performed. In this embodiment, heat treatment is performed at 450° C.

As described above, when the nitrogen 210 is added to the upper layers 211au and 211bu, microvoids are formed in the upper layers 211au and 211bu. A plurality of microvoids is formed in the regions (the upper layers 211au and 211bu) of the oxide semiconductor layer 203, to which nitrogen 210 is added.

FIGS. 5A to 5D are TEM photographs of a cross section of an oxide semiconductor layer (magnification: 4000,000 times). In order to confirm the formation of microvoids, whether to add nitrogen and the dose of nitrogen are changed.

In FIGS. 5A to 5D, a silicon nitride film containing oxygen is formed with a thickness of 300 nm as the base insulating film 202, and an In—Ga—Zn-based oxide film (also referred to as an IGZO film) is formed with a thickness of 30 nm as the oxide semiconductor layer 203 over the base insulating film 202. After the formation of the base insulating film 202 and the oxide semiconductor layer 203, heat treatment is performed at 450° C. for one hour in a nitrogen atmosphere.

Figure 5A:
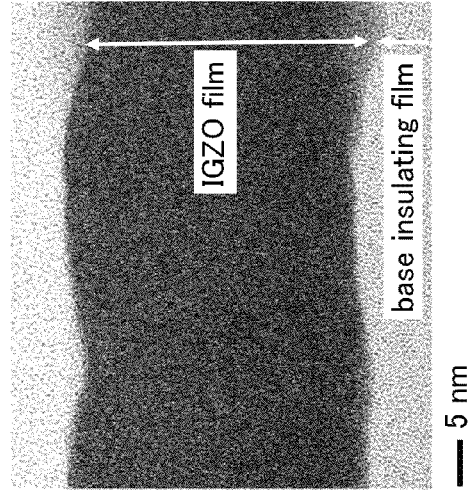
FIGS. 5A to 5D are TEM photographs of a cross section of an oxide semiconductor layer.
Figure 5B:
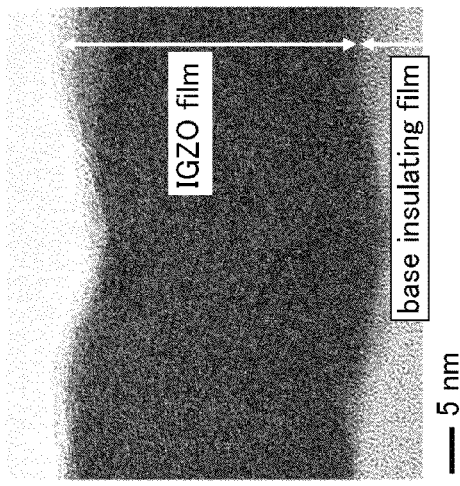
Figure 5C:
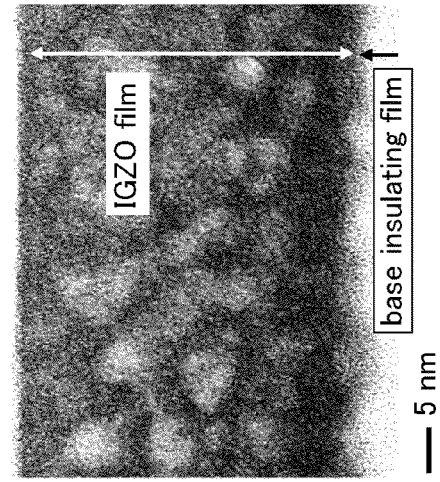
Figure 5D:
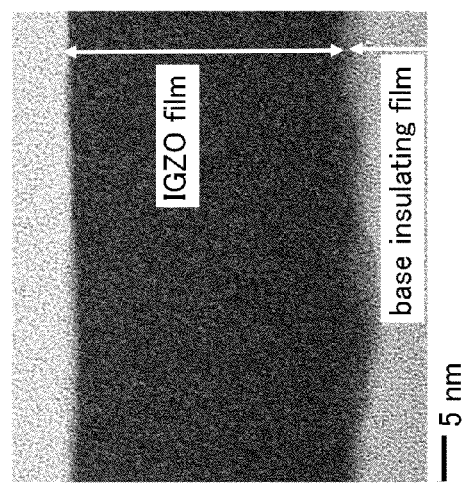

FIG. 5A is a TEM photograph of the cross section of the oxide semiconductor layer 203 to which nitrogen is not added. FIG. 5B is a TEM photograph of the cross section of the oxide semiconductor layer 203 to which nitrogen is added at a dose of $1\times10^{15}$ cm$^{-2}$. FIG. 5C is a TEM photograph of the cross section of the oxide semiconductor layer 203 to which nitrogen is added at a dose of $1\times10^{16}$ cm$^{-2}$. FIG. 5D is a TEM photograph of the cross section of the oxide semiconductor layer 203 to which nitrogen is added at a dose of $5\times10^{16}$ cm$^{-2}$. Note that nitrogen is added at an accelerating voltage of 20 kV.

FIGS. 5A to 5D show that microvoids are formed in the oxide semiconductor layer 203 when nitrogen is added at a dose of $5\times10^{16}$ cm$^{-2}$ (see FIG. 5D).

Thus, it is preferable that nitrogen be added at a dose of $5\times10^{16}$ cm$^{-2}$ so that the microvoids are formed in the oxide semiconductor layer 203.

When oxygen is extracted from the oxide semiconductor layer 203, the oxide semiconductor transistor has a low on/off ratio. However, if hydrogen is adsorbed to the inner walls of the microvoids, hydrogen does not react with oxygen, so that water and the like are not formed; thus, oxygen is not extracted from the oxide semiconductor layer 203.

As described, the oxide semiconductor transistor 201 including the oxide semiconductor layer 203 in which hydrogen is adsorbed to the inner walls of the microvoids and from which oxygen is not extracted becomes a transistor with a sufficient on/off ratio.

The lower layer 211al in the region 211a and the lower layer 211bl in the region 211b are regions which do not contain nitrogen or regions which contain nitrogen at a concentration which is extremely low compared with the upper layers 211au and 211bu.

The microvoids are provided in the oxide semiconductor layer 203 as described above, so that an oxide semiconductor transistor with a sufficient on/off ratio can be formed. However, when the microvoids are formed, on-state current of the oxide semiconductor transistor 201 in which a current pathway has cut is reduced.

Nitrogen is not added to the lower layers 211al and 211bl, whereby microvoids are not formed therein. Thus, the decrease in the on-state current can be suppressed by the formation of the lower layers 211al and 211bl.

Note that a metal film, a metal oxide film, a metal nitride film, or the like may be formed over the oxide semiconductor layer 203 so that nitrogen is not added to the lower layers 211al and 211bl of the oxide semiconductor layer 203. In the case where the metal film, the metal oxide film, the metal nitride film, or the like is formed, nitrogen is added to the oxide semiconductor layer 203 through the film. Accordingly, nitrogen does not reach the lower layers 211al and 211bl; thus, nitrogen can be prevented from being added to the lower layers 211al and 211bl.

Next, contact holes which reach the electrode 204a, the electrode 204b, and the gate electrode 207 are formed in the insulating film 212. Next, the wiring 213, the wiring 214, and the wiring 215 which are electrically connected to the electrode 204a, the electrode 204b, and the gate electrode 207, respectively through the contact holes are formed over the insulating film 212 (see FIG. 1).

Further, as described above, microvoids are formed in the oxide semiconductor layer 203 also in the case where oxygen is added to the oxide semiconductor layer 203 instead of nitrogen. Similarly to the case where nitrogen is added, oxygen is not extracted from the oxide semiconductor layer 203 to which oxygen is added. Thus, the oxide semiconductor transistor 201 including the oxide semiconductor layer 203 to which oxygen is added becomes an oxide semiconductor transistor with a sufficient on/off ratio similarly to the case where nitrogen is added. Note that it is preferable that oxygen be added at a dose of $5\times10^{16}$ cm$^{-2}$ or more similarly to the case where nitrogen is added.

<Another Structural Example of Oxide Semiconductor Transistor and Manufacturing Method Thereof>

In the oxide semiconductor transistor 201, the lower layers 211al and 211bl are regions which do not contain nitrogen or regions which contain nitrogen at a concentration which is extremely low compared with the upper layers 211au and 211bu.

The lower layers 211al and 211bl may contain nitrogen at such a dose that microvoids are not formed. When the lower layers 211al and 211bl contain nitrogen, the lower layers 211al and 211bl become n-type regions, so that on-state current easily flows.

Description is given on a method for manufacturing the oxide semiconductor transistor 221 in which the lower layers 211al and 211bl are low-concentration nitrogen-containing regions.

Figure 3A:
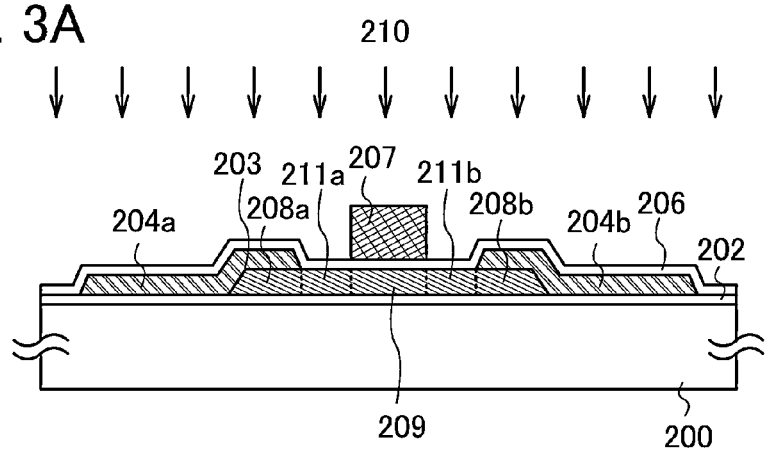
FIGS. 3A to 3D are cross-sectional views showing a method for manufacturing a semiconductor device.
Figure 3B:
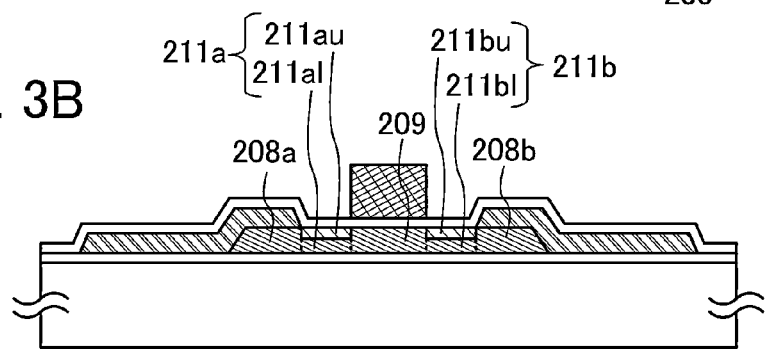

First, the steps up to the addition of the nitrogen 210 are performed according to the steps shown in FIGS. 2A to 2D (see FIG. 3A). Note that FIG. 3A corresponds to FIG. 2D. Accordingly, the upper layers 211au and 211bu become high-concentration nitrogen-containing regions (see FIG. 3B). Note that the addition of the nitrogen 210 shown in FIG. 3A is a first addition.

Figure 3C:
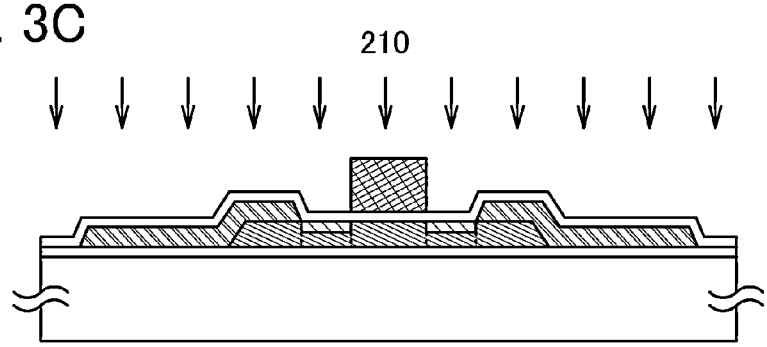

Next, the nitrogen 210 is added to the oxide semiconductor layer 203 again (second addition) (see FIG. 3C). The second addition of the nitrogen 210 is performed under the condition where the dose of the second addition is lower than that of the first addition. Further, the second addition of the nitrogen 210 is performed at a higher accelerating voltage than the first addition so that the nitrogen 210 reaches the lower layers 211al and 211bl.

Figure 3D:
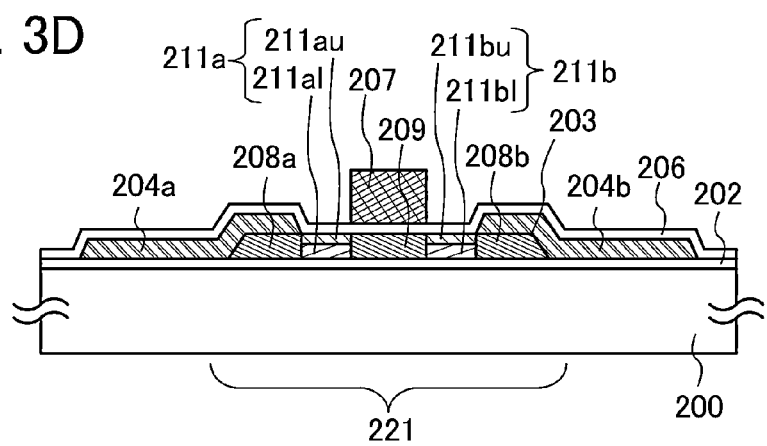

By the second addition of the nitrogen 210, the lower layers 211al and 211bl become low-concentration nitrogen-containing regions (see FIG. 3D), whereby on-state current easily flows.

An example is illustrated in which, with reference to FIGS. 3A to 3D, the upper layers 211au and 211bu that are high-concentration nitrogen-containing regions and the lower layers 211al and 211bl that are low-concentration nitrogen-containing regions are formed by the addition of nitrogen twice; however, the present invention is not limited thereto. By adjustment of a concentration profile in the first addition of nitrogen, nitrogen is also added to the lower layers 211al and 211bl.

Figure 4A:
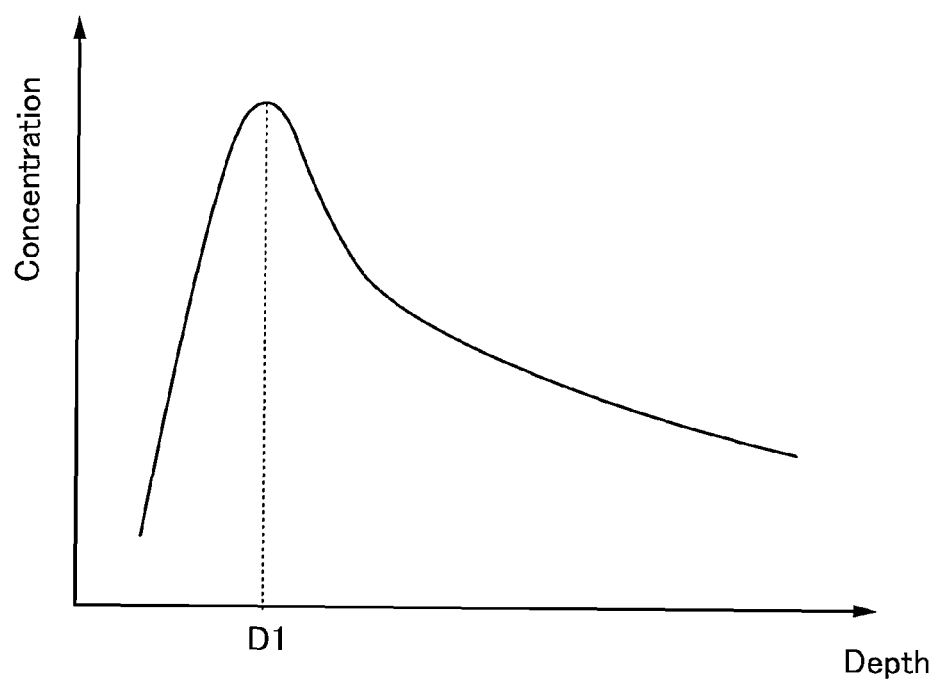
FIGS. 4A and 4B each show a nitrogen concentration profile.

FIG. 4A shows a concentration profile of nitrogen that is added. As shown in FIG. 4A, the concentration of nitrogen increases with respect to the depth at first and has the maximum value at predetermined depth D1. As the depth becomes greater than D1, the concentration of nitrogen decreases gradually.

Figure 4B:
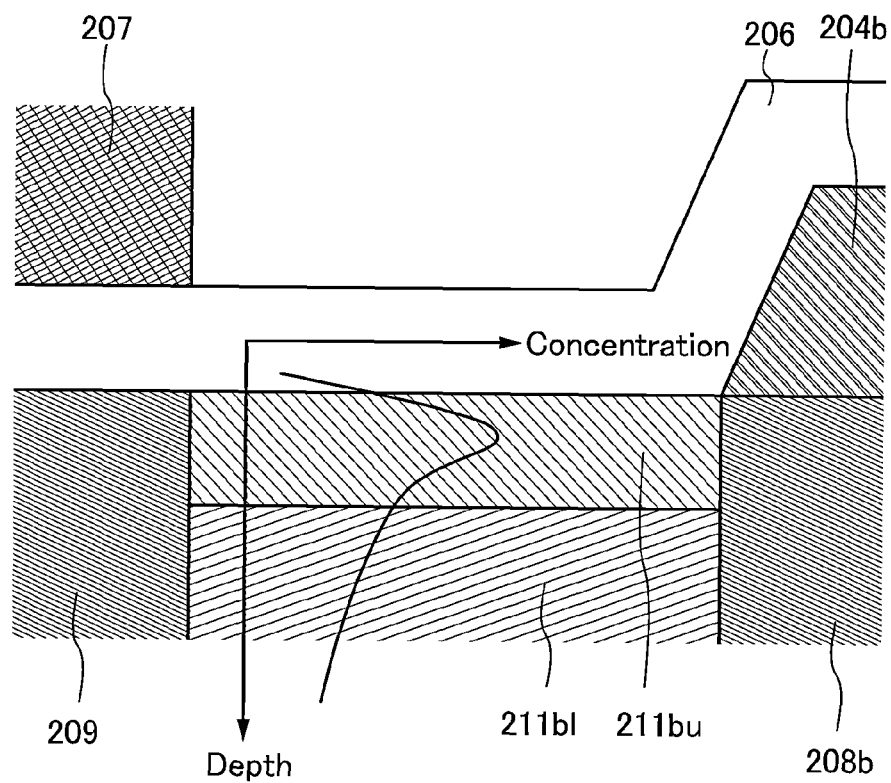

FIG. 4B shows a concentration profile of nitrogen in the upper layer 211bu and the lower layer 211bl when nitrogen is added at a high accelerating voltage.

As shown in FIG. 4B, the upper layer 211bu has the maximum value of nitrogen concentration. In the lower layer 211bl, the nitrogen concentration is low.

As described above, the control of the accelerating voltage enables the formation of the high-concentration nitrogen-containing regions and the low-concentration nitrogen-containing regions only by the first addition of nitrogen.

After the nitrogen 210 is added to the oxide semiconductor layer 203, the insulating film 212 is formed to cover the substrate 200, the base insulating film 202, the oxide semiconductor layer 203, the electrodes 204a and 204b, the gate insulating film 206, and the gate electrode 207. After the formation of the insulating film 212, heat treatment is performed. In this embodiment, heat treatment is performed at 450° C.

Figure 12:
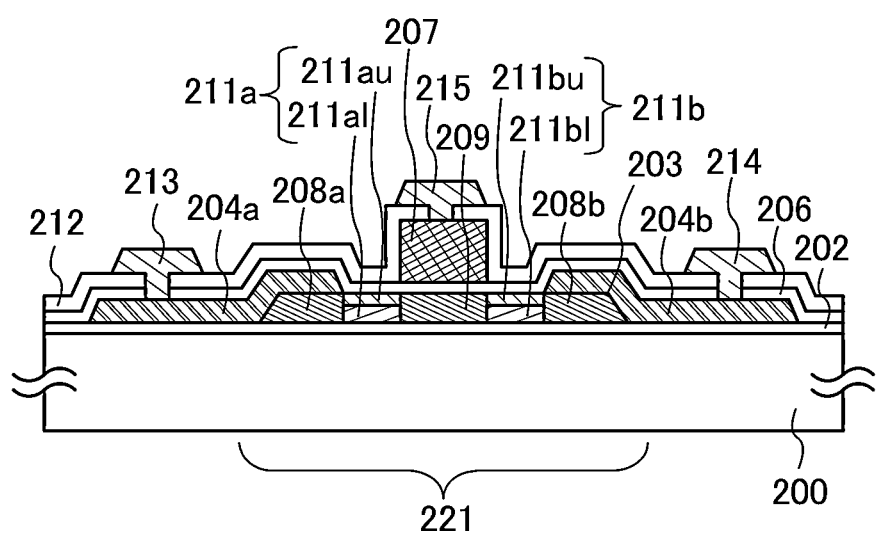
FIG. 12 is a cross-sectional view showing a method for manufacturing the semiconductor device.

Next, contact holes which reach the electrode 204a, the electrode 204b, and the gate electrode 207 are formed in the insulating film 212. Next, the wiring 213, the wiring 214, and the wiring 215 which are electrically connected to the electrode 204a, the electrode 204b, and the gate electrode 207, respectively through the contact holes are formed over the insulating film 212 (see FIG. 12).

Note that instead of nitrogen, oxygen may be added to the oxide semiconductor transistor 221 shown FIG. 3A to 3D and FIG. 12. Even in the case where oxygen is added to the oxide semiconductor transistor 221 instead of nitrogen, microvoids are formed; thus, an oxide semiconductor transistor with a sufficient high on/off ratio can be formed.

[Embodiment 2]

In this embodiment, an oxide semiconductor layer which can be used in one embodiment of the disclosed invention is described.

An oxide semiconductor included in the oxide semiconductor layer which can be used in one embodiment of the disclosed invention preferably contains at least indium (In) or zinc (Zn). In particular, In and Zn are preferably contained. In addition, as a stabilizer for reducing the variation in electric characteristics of a transistor using the oxide, the oxide semiconductor preferably contains gallium (Ga) in addition to In and Zn. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain a metal element other than the In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material represented by In$_2$SnO$_5$(ZnO)$_n$ (n>0, n is a natural number) may be used.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

However, without limitation to the materials given above, a material with an appropriate composition may be used depending on needed semiconductor characteristics (e.g., mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

For example, high mobility can be obtained relatively easily in the case of using an In—Sn—Zn-based oxide. However, even with an In—Ga—Zn-based oxide, mobility can be increased by reducing the defect density in the bulk.

Note that the case where the composition of an oxide having an atomic ratio, In:Ga:Zn=a:b:c (a+b+c=1), is in the neighborhood of the composition of an oxide having an atomic ratio, In:Ga:Zn=A:B:C (A+B+C=1), means that a, b, and c satisfy the following relation: $(a-A)^2+(b-B)^2 \le r^2$, and r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In an oxide semiconductor having crystallinity, defects in the bulk can be further reduced and when a surface flatness is improved, mobility higher than that of an oxide semiconductor layer in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, more preferably less than or equal to 0.1 nm.

Note that, R$_a$ is obtained by three-dimension expansion of arithmetic mean deviation so as to be able to apply it to a plane. The R$_a$ can be expressed as an "average value of the absolute values of deviations from a reference surface to a specific surface" and is defined by the formula below.

$$Ra = \frac{1}{S_0} \int_{y_1}^{y_2} \int_{x_1}^{x_2} |f(x, y) - Z_0| dx dy \qquad \text{[FORMULA 1]}$$

In the above formula, S$_0$ represents an area of a plane to be measured (a quadrangular region which is defined by four points represented by coordinates $(x_1, y_1)$, $(x_1, y_2)$, $(x_2, y_1)$, and $(x_2, y_2)$), and Z$_0$ represents an average height of the plane to be measured. Ra can be measured using an atomic force microscope (AFM).

Here, as the oxide semiconductor having crystallinity, an oxide including a crystal with c-axis alignment (also referred to as c-axis aligned crystal (CAAC)), which has a triangular or hexagonal atomic arrangement when seen from the direction of an a-b plane, a surface, or an interface may be used. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis). An oxide including CAAC is described below.

In a broad sense, an oxide including CAAC means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a substrate over which the CAAC is formed, and in which metal atoms are arranged in a layered manner or metal atoms and oxygen atoms (or nitrogen atoms) are arranged in a layered manner when a cross section of the film is observed.

An example of a crystal structure of the CAAC is described in detail with reference to FIGS. 8A to 8E, FIGS. 9A to 9C, and FIGS. 10A to 10C. In FIGS. 8A to 8E, FIGS. 9A to 9C, and FIGS. 10A to 10C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 8A to 8E, O surrounded by a circle represents tetracoordinate O and O surrounded by a double circle represents tricoordinate O.

Figure 8A:
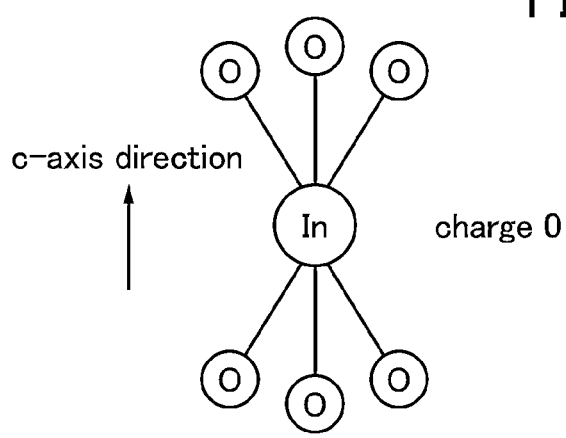
FIGS. 8A to 8E each show a structure of an oxide material.

FIG. 8A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 8A is actually an octahedral structure, but is illustrated as a planar structure for simplicity. Note that three tetracoordinate O atoms exist in each of an upper half and a lower half in FIG. 8A. In the small group illustrated in FIG. 8A, electric charge is 0.

Figure 8D:
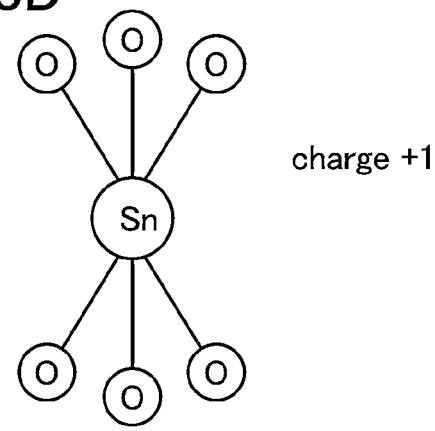
Figure 8B:
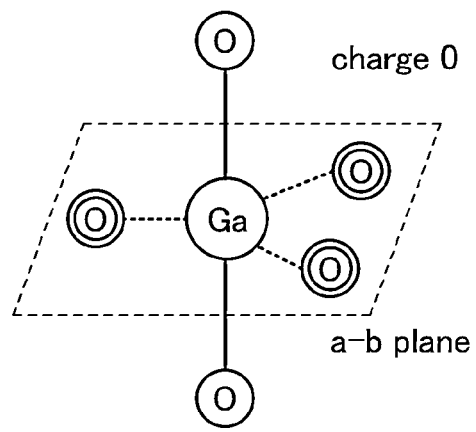

FIG. 8B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 8B. An In atom can also have the structure illustrated in FIG. 8B because an In atom can have five ligands. In the small group illustrated in FIG. 8B, electric charge is 0.

Figure 8E:
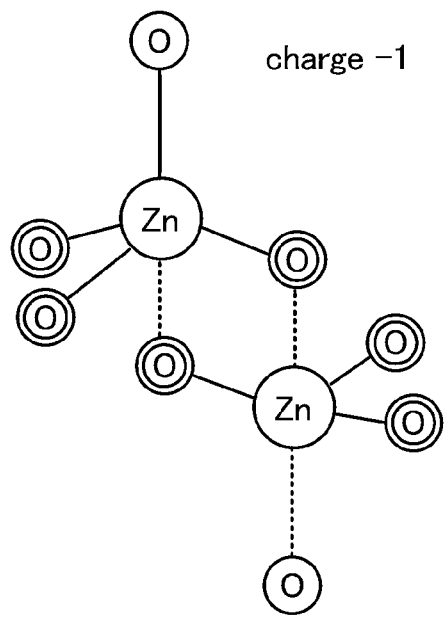
Figure 8C:
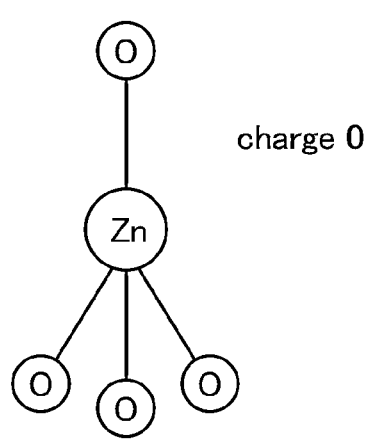

FIG. 8C illustrates a structure including one tetracoordinate Zn atom and four tetracoordinate O atoms proximate to the Zn atom. In FIG. 8C, one tetracoordinate O atom exists in an upper half and three tetracoordinate O atoms exist in a lower half. In the small group illustrated in FIG. 8C, electric charge is 0.

FIG. 8D illustrates a structure including one hexacoordinate Sn atom and six tetracoordinate O atoms proximate to the Sn atom. In FIG. 8D, three tetracoordinate O atoms exist in each of an upper half and a lower half. In the small group illustrated in FIG. 8D, electric charge is +1.

FIG. 8E illustrates a small group including two Zn atoms. In FIG. 8E, one tetracoordinate O atom exists in each of an upper half and a lower half. In the small group illustrated in FIG. 8E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the In atom each have three proximate In atoms in the downward direction, and the three O atoms in the lower half each have three proximate In atoms in the upward direction. The one O atom in the upper half with respect to the Ga atom has one proximate Ga atom in the downward direction, and the one O atom in the lower half has one proximate Ga atom in the upward direction. The one O atom in the upper half with respect to the Zn atom has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the proximity metal atoms above the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. The reason will be described hereinafter. For example, in the case where the hexacoordinate metal (In or Sn) atom is bonded through three tetracoordinate O atoms in the upper half, it is bonded to tetracoordinate O atoms in the upper half of the pentacoordinate metal (Ga or In) atom, tetracoordinate O atoms in the lower half of the pentacoordinate metal (Ga or In) atom, or tetracoordinate O atoms in the upper half of the tetracoordinate metal (Zn) atom.

A metal atom having the above coordination number is bonded to another metal atom through a tetracoordinate O atom in the c-axis direction. In addition to the above, a medium group can be formed in a different manner by combination of a plurality of small groups so that the total electric charge of the layered structure is 0.

Figure 9A:
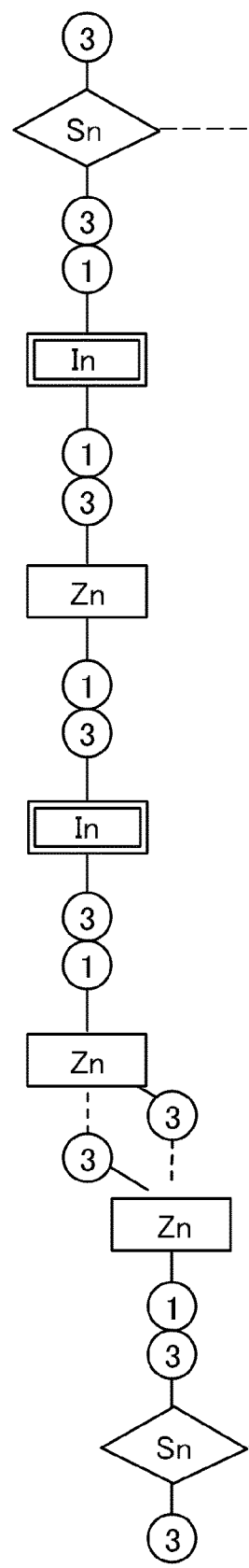
FIGS. 9A to 9C each show a structure of an oxide material.
Figure 9B:
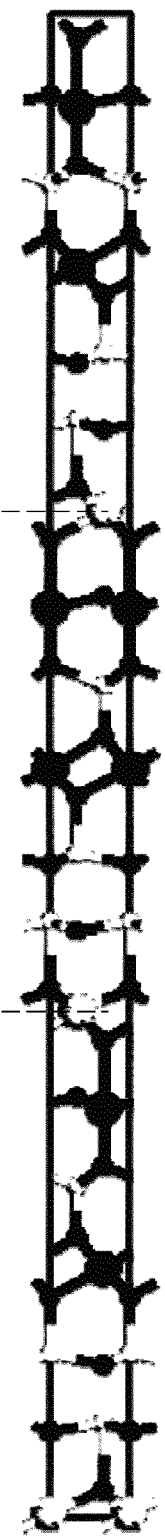
Figure 9C:
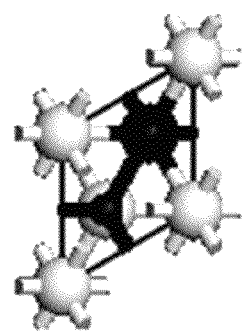

FIG. 9A illustrates a model of a medium group included in a layered structure of an In—Sn—Zn-based oxide. FIG. 9B illustrates a large group including three medium groups. Note that FIG. 9C illustrates an atomic arrangement in the case where the layered structure in FIG. 9B is observed from the c-axis direction.

In FIG. 9A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 9A, one tetracoordinate O atom existing in each of an upper half and a lower half with respect to an In atom is denoted by circled 1. FIG. 9A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn-based oxide in FIG. 9A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 8E can be given. For example, with one small group including two Zn atoms, electric charge of one small group including a Sn atom can be cancelled, so that the total electric charge of the layered structure can be 0.

When the large group illustrated in FIG. 9B is repeated, a crystal of an In—Sn—Zn-based oxide ($In_2SnZn_3O_8$) can be obtained. Note that a layered structure of the obtained In—Sn—Zn-based oxide can be expressed as a composition formula, $In_2SnZn_2O_7(ZnO)_m$ (m is 0 or a natural number). As larger m is, the crystallinity of the In—Sn—Zn-based oxide is improved, which is preferable.

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Pm—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; an In-based oxide, a Sn-based oxide, or a Zn-based oxide; and the like.

Figure 10A:
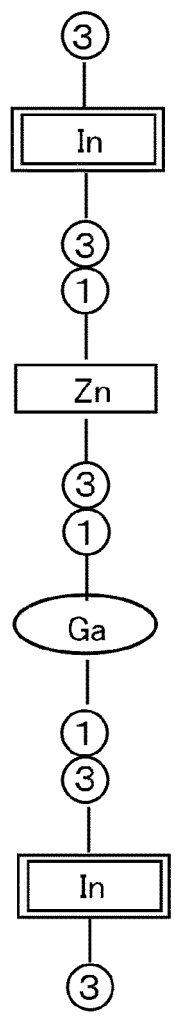
FIGS. 10A to 10C each show a structure of an oxide material.

As an example, FIG. 10A illustrates a model of a medium group included in a layered structure of an In—Ga—Zn-based oxide.

In the medium group included in the layered structure of the In—Ga—Zn-based oxide in FIG. 10A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 10B:
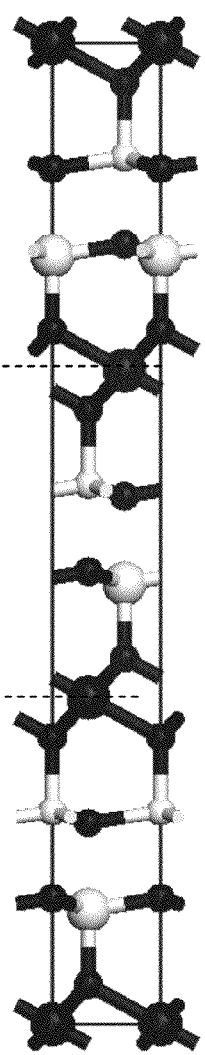
Figure 10C:
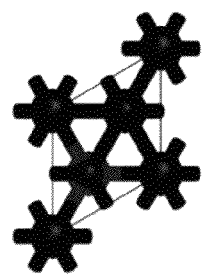

FIG. 10B illustrates a large group including three medium groups. Note that FIG. 10C illustrates an atomic arrangement in the case where the layered structure in FIG. 10B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn-based oxide, a large group can be formed using not only the medium group illustrated in FIG. 10A but also a medium group in which the arrangement of the In atom, the Ga atom, and the Zn atom is different from that in FIG. 10A.

For an In—Sn—Zn-based oxide, an oxide target having a composition ratio of In:Sn:Zn=1:2:2, 2:1:3, 1:1:1, or 20:45:35 in an atomic ratio is used, for example.

EXAMPLE 1

FIGS. 6A to 6H and FIGS. 7A to 7D each show the relation between the gate voltage ($V_g$) and the drain current ($I_d$) of an oxide semiconductor transistor in the case where the channel length L, whether to add nitrogen, and the dose of nitrogen are changed.

Note that the channel lengths L of the oxide semiconductors are 0.35 µm, 0.8 µm, 3.0 µm, and 10.0 µm in FIG. 6A, FIG. 6B and FIG. 7A, FIG. 6C, FIG. 6D and FIG. 7B, FIG. 6E, FIG. 6F and FIG. 7C, FIG. 6G, FIG. 6H and FIG. 7D, respectively, and the channel width (W) of each of the oxide semiconductor transistors is 10 µm.

FIGS. 6A, 6C, 6E, and 6G each show the case where nitrogen is not added to the oxide semiconductor transistor and heat treatment at 450° C. is performed. FIGS. 6B, 6D, 6F, and 6H each show the case where nitrogen is added to the oxide semiconductor transistor with an accelerating voltage of 10 kV and a dose of $1 \times 10^{14}$ cm$^{-2}$ and heat treatment at 450° C. is performed. FIGS. 7A to 7D each show the case where nitrogen is added to the oxide semiconductor transistor with an accelerating voltage of 10 kV and a dose of $5 \times 10^{16}$ cm$^{-2}$ and heat treatment at 450° C. is performed.

As shown in FIGS. 6A to 6F, when the channel length (L) is short (3.0 µm or less) and the dose is low ($1 \times 10^{14}$ cm$^{-2}$ or less), a sufficient on/off ratio cannot be obtained and the drain current ($I_d$) does not change even in the case where the gate voltage ($V_g$) changes. That is, such an oxide semiconductor transistor does not function as a transistor.

Figure 6A:
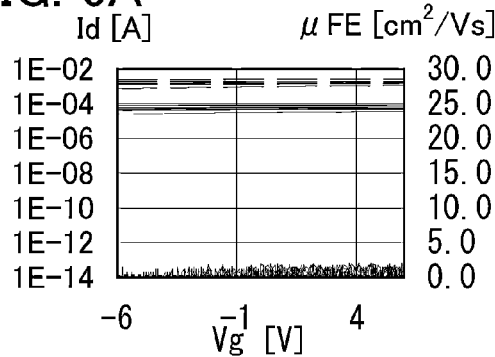
FIGS. 6A to 6H each show a relation between gate voltage and drain current.
Figure 6B:
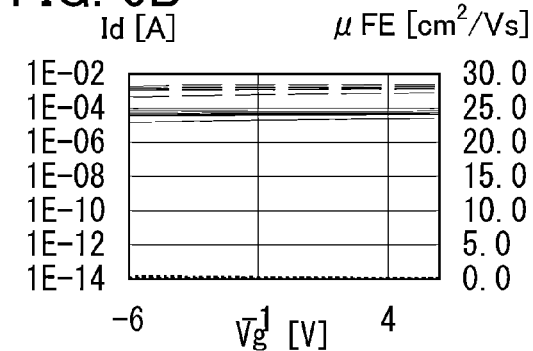
Figure 6C:
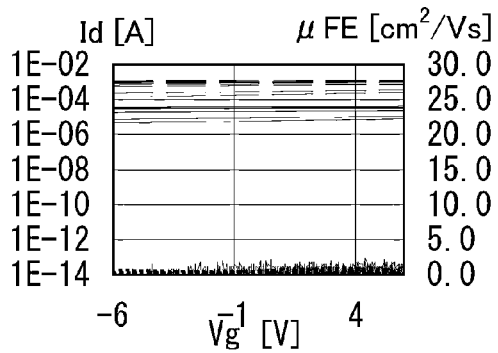
Figure 6D:
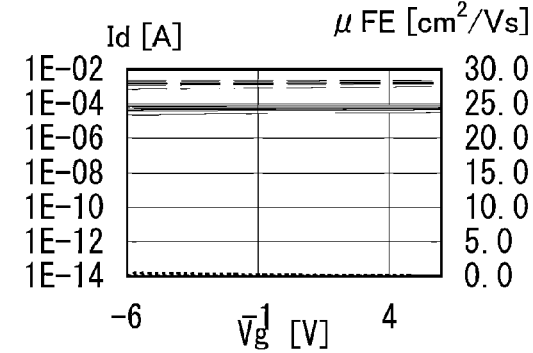
Figure 6E:
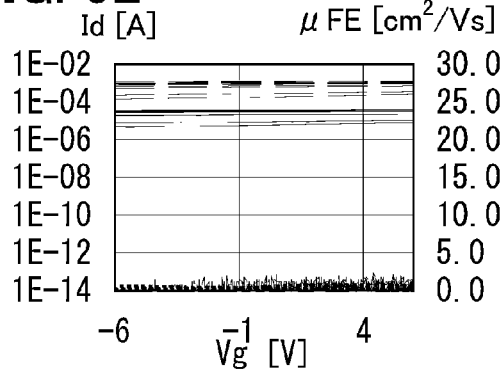
Figure 6F:
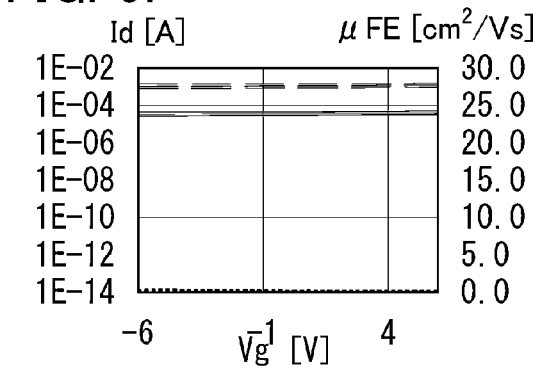
Figure 6G:
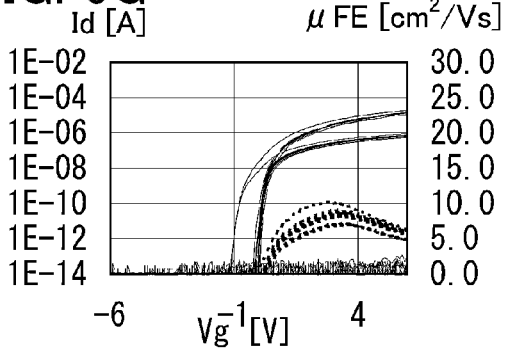
Figure 6H:
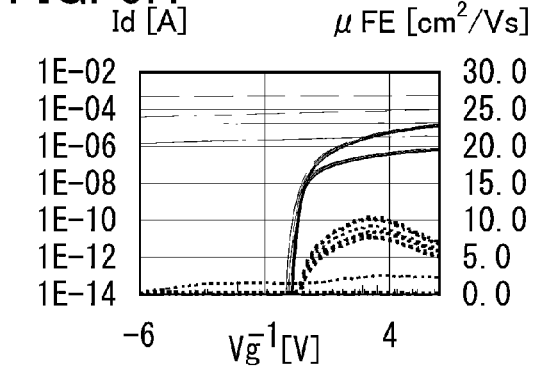

As shown in FIGS. 6A, 6C, and 6H, when nitrogen is not added, a sufficient on/off ratio of the oxide semiconductor transistor can not be obtained and the oxide semiconductor transistor does not function as a transistor.

Further, as shown in FIGS. 6B, 6D, and 6F, when nitrogen is added but the dose is low ($1 \times 10^{14}$ cm$^{-2}$), a sufficient on/off ratio of the oxide semiconductor transistor can not be obtained and the oxide semiconductor transistor does not function as a transistor.

Figure 7A:
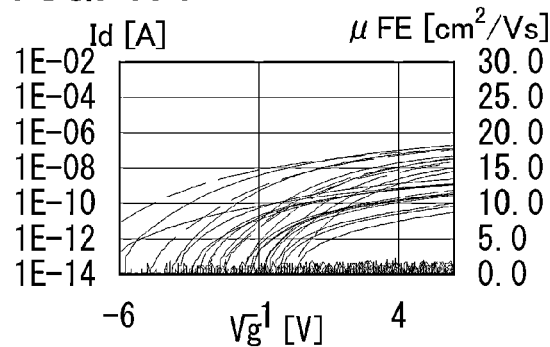
FIGS. 7A to 7D each show a relation between gate voltage and drain current.
Figure 7B:
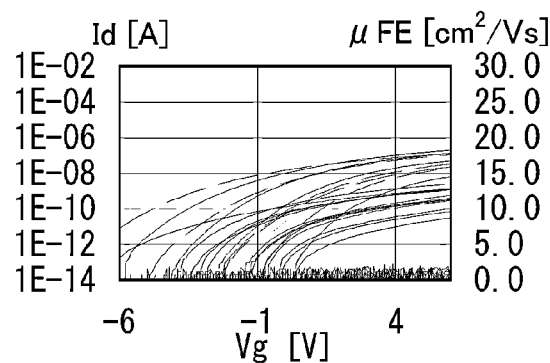
Figure 7C:
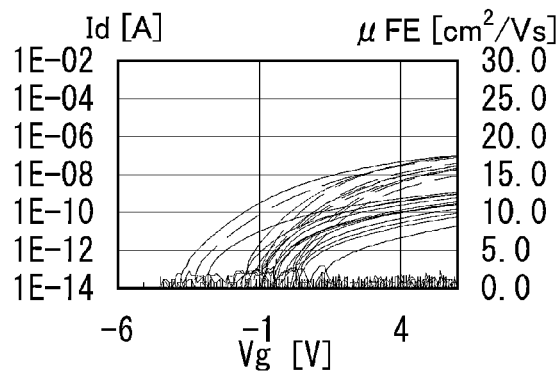
Figure 7D:
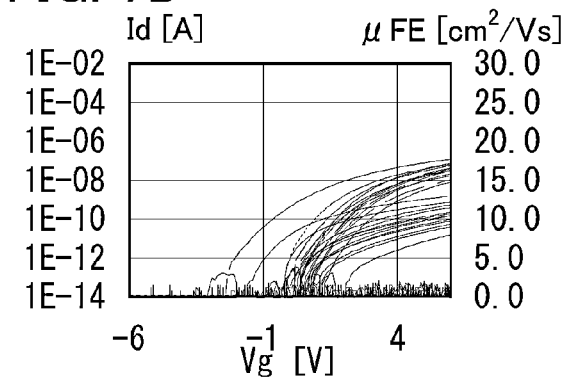

However, as shown in FIGS. 7A to 7C, even in the case where the oxide semiconductor transistor to which nitrogen is added with a dose of $5 \times 10^{-6}$ cm$^{-2}$ has a short channel length, for example, 0.35 µm (see FIG. 7A), a sufficient on/off ratio can be obtained. That is, the drain current ($I_d$) changes with a change in the gate voltage ($V_g$). The oxide semiconductor transistors shown in FIGS. 7A to 7C each function as a transistor.

FIGS. 6A to 6H and FIGS. 7A to 7D show that the oxide semiconductor transistor to which nitrogen is added with a dose of less than $5 \times 10^{16}$ cm$^{-2}$, for example, $1 \times 10^{14}$ cm$^{-2}$ does not have a sufficient on/off ratio even in the case where the channel length (L) is long, for example, 3.0 µm. Thus, it is preferable that the dose of nitrogen be $5 \times 10^{16}$ cm$^{-2}$ or more in the oxide semiconductor transistor with a short channel length (L) of, for example, 3.0 µm or less.

As described in Embodiment 1, microvoids are formed in an oxide semiconductor layer when the dose of nitrogen is $5 \times 10^{16}$ cm$^{-2}$ or more. Further, hydrogen from external air or an insulating film is adsorbed to the inner walls of the microvoids in the oxide semiconductor layer; thus, oxygen is not extracted from the oxide semiconductor layer. An oxide semiconductor transistor having the oxide semiconductor layer whose oxygen is not extracted, can have a sufficient on/off ratio, and the drain current $I_d$ changes with a change in the gate voltage $V_g$. That is, the oxide semiconductor transistor functions as a transistor.

This example shows that one embodiment of the disclosed invention can have a sufficient on/off ratio even in the case where the channel length L is short.

EXPLANATION OF REFERENCE

200: substrate, 201: oxide semiconductor transistor, 202: base insulating film, 203: oxide semiconductor layer, 204*a*: electrode, 204*b*: electrode, 206: gate insulating film, 207: gate electrode, 208*a*: region, 208*b*: region, 209: channel formation region, 210: nitrogen, 211*a*: region, 211*au*: upper layer, 211*al*: lower layer, 211: region, 211*bu*: upper layer, 211*bl*: lower layer, 212: insulating film, 213: wiring, 214: wiring, 215: wiring, 221: oxide semiconductor transistor This application is based on Japanese Patent Application serial no. 2011-147520 filed with Japan Patent Office on Jul. 1, 2011, the entire contents of which are hereby incorporated by reference.

The invention claimed is:

1. A semiconductor device comprising:
a substrate;
an oxide semiconductor layer over the substrate;
a gate insulating film over the oxide semiconductor layer;
a gate electrode over a channel formation region of the oxide semiconductor layer with the gate insulating film provided therebetween;
an electrode provided over a first region of the oxide semiconductor layer; and
a second region of the oxide semiconductor layer between the channel formation region and the first region,
wherein a thickness of the oxide semiconductor layer is greater than or equal to 20 nm and less than or equal to 100 nm,
wherein the electrode is a source electrode or a drain electrode,
wherein the electrode and the gate electrode do not overlap the second region of the oxide semiconductor layer,
wherein the second region comprises an upper region in contact with the gate insulating film and a lower region between the upper region and the substrate,
wherein the upper region includes a microvoid,
wherein the lower region is an n-type region,
wherein hydrogen in the oxide semiconductor layer is adsorbed to an inner wall of the microvoid, and
wherein each of the lower region, the first region and the channel formation region does not include a microvoid.

2. The semiconductor device according to claim 1, wherein a diameter of the microvoid is larger than or equal to 2 nm and smaller than or equal to 7 nm.

3. The semiconductor device according to claim 1, wherein the microvoid is a region which has low density compared with the surrounding thereof or an empty space.

4. The semiconductor device according to claim 1,
wherein the oxide semiconductor layer contains indium, gallium and zinc, and
wherein the oxide semiconductor layer comprises crystals whose c-axes are aligned.

5. A semiconductor device comprising:
a substrate;
an oxide semiconductor layer over the substrate;
a gate insulating film provided over the oxide semiconductor layer;
a gate electrode over a channel formation region of the oxide semiconductor layer with the gate insulating film provided therebetween;
an electrode provided over a first region of the oxide semiconductor layer; and
a second region of the oxide semiconductor layer between the channel formation region and the first region,
wherein a thickness of the oxide semiconductor layer is greater than or equal to 20 nm and less than or equal to 100 nm,
wherein the electrode is a source electrode or a drain electrode,
wherein the electrode and the gate electrode do not overlap the second region of the oxide semiconductor layer,
wherein the second region comprises an upper region in contact with the gate insulating film and a lower region between the upper region and the substrate,
wherein the upper region contains more nitrogen than each of the lower region, the first region and the channel formation region,
wherein the upper region includes a microvoid,
wherein the lower region is an n-type region,
wherein hydrogen in the oxide semiconductor layer is adsorbed to an inner wall of the microvoid, and
wherein each of the lower region, the first region and the channel formation region does not include a microvoid.

6. The semiconductor device according to claim 5, wherein the concentration of nitrogen in the upper region of the second region is $1\times10^{21}$ cm$^{-3}$ or more.

7. The semiconductor device according to claim 5, wherein a diameter of the microvoid is larger than or equal to 2 nm and smaller than or equal to 7 nm.

8. The semiconductor device according to claim 5, wherein the microvoid is a region which has low density compared with the surrounding thereof or an empty space.

9. The semiconductor device according to claim 5,
wherein the oxide semiconductor layer contains indium, gallium and zinc, and
wherein the oxide semiconductor layer comprises crystals whose c-axes are aligned.

10. A semiconductor device comprising:
a substrate;
an oxide semiconductor layer over the substrate;
a gate insulating film provided over the oxide semiconductor layer;
a gate electrode over a channel formation region of the oxide semiconductor layer with the gate insulating film provided therebetween;
an electrode provided over a first region of the oxide semiconductor layer; and
a second region of the oxide semiconductor layer between the channel formation region and the first region,
wherein a thickness of the oxide semiconductor layer is greater than or equal to 20 nm and less than or equal to 100 nm,
wherein the electrode is a source electrode or a drain electrode,
wherein the electrode and the gate electrode do not overlap the second region of the oxide semiconductor layer,
wherein the second region comprises an upper region in contact with the gate insulating film and a lower region between the upper region and the substrate,
wherein the upper region has a maximum value of nitrogen concentration in the second region,
wherein the upper region includes a microvoid,
wherein the lower region is an n-type region,
wherein hydrogen in the oxide semiconductor layer is adsorbed to an inner wall of the microvoid, and
wherein each of the lower region, the first region and the channel formation region does not include a microvoid.

11. The semiconductor device according to claim 10, wherein the concentration of nitrogen in the upper region of the second region is $1\times10^{21}$ cm$^{-3}$ or more.

12. The semiconductor device according to claim 10, wherein a diameter of the microvoid is larger than or equal to 2 nm and smaller than or equal to 7 nm.

13. The semiconductor device according to claim 10, wherein the microvoid is a region which has low density compared with the surrounding thereof or an empty space.

14. The semiconductor device according to claim 10,
wherein the oxide semiconductor layer contains indium, gallium and zinc, and
wherein the oxide semiconductor layer comprises crystals whose c-axes are aligned.

* * * * *